United States Patent
Song

(10) Patent No.: US 11,017,840 B1
(45) Date of Patent: May 25, 2021

(54) SEMICONDUCTOR DEVICES

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/827,062

(22) Filed: Mar. 23, 2020

(30) Foreign Application Priority Data

Oct. 30, 2019 (KR) ........................ 10-2019-0136530

(51) Int. Cl.
  *G11C 11/40* (2006.01)
  *G11C 11/408* (2006.01)
  *G11C 11/4096* (2006.01)

(52) U.S. Cl.
  CPC ...... *G11C 11/4085* (2013.01); *G11C 11/4082* (2013.01); *G11C 11/4096* (2013.01)

(58) Field of Classification Search
  CPC ............ G11C 11/4085; G11C 11/4082; G11C 11/4096; G11C 7/1027
  See application file for complete search history.

(56) References Cited

U.S. PATENT DOCUMENTS

| 6,173,238 B1 * | 1/2001 | Fujisaki ................. | G11C 29/44 702/117 |
| 9,236,108 B1 * | 1/2016 | Jang ................... | G11C 11/40618 |
| 2005/0207257 A1 * | 9/2005 | Skidmore ............... | G11C 8/12 365/230.01 |
| 2016/0180904 A1 * | 6/2016 | Park ........................ | G11C 8/12 365/191 |

FOREIGN PATENT DOCUMENTS

| KR | 1020170112038 A | 10/2017 |
| KR | 1020190022922 A | 3/2019 |

* cited by examiner

*Primary Examiner* — Han Yang
(74) *Attorney, Agent, or Firm* — William Park & Associates Ltd.

(57) ABSTRACT

A semiconductor device includes a row address generation circuit, a first region, and a second region. The row address generation circuit is configured to generate a first row address from an active signal and a first bank address and configured to generate a second row address from the active signal and a second bank address. The first region is activated by the first row address and an internal address. The second region is activated by the second row address and the internal address. One of the first and second bank addresses is selectively generated according to a command/address signal.

23 Claims, 12 Drawing Sheets

| CS | CA<1> | CA<2> | CA<3> | CA<4> | CA<5> | CA<6> |
|---|---|---|---|---|---|---|
| L | L | L | H or L | H or L | H or L | H or L |
| H | H or L | X | X | X | X | X |

FIG. 2

| CS | CA<1> | CA<2> | CA<3> | CA<4> | CA<5> | CA<6> |
|---|---|---|---|---|---|---|
| L | L | L | H or L | H or L | H or L | H or L |
| H | H or L | H or L | X | X | X | X |

FIG. 11

SEMICONDUCTOR DEVICES

CROSS-REFERENCE TO RELATED APPLICATIONS

The present application claims priority under 35 U.S.C 119(a) to Korean Application No. 10-2019-0136530, filed on Oct. 30, 2019, which is incorporated herein by reference in its entirety.

BACKGROUND

1. Technical Field

Embodiments of the present disclosure relate to semiconductor devices, and more particularly, to semiconductor devices providing a test mode in which a compressive test for bits included in data is executed.

2. Related Art

In the case of semiconductor devices such as dynamic random access memory (DRAM) devices, a read operation and a write operation have to be accurately performed without even a single bit failure in each semiconductor chip (i.e., each semiconductor device). However, in spite of fabrication process techniques, probability of cell failures may become higher because the number of cells integrated in a single semiconductor chip increases with the development of techniques. Accordingly, if a test for failed cells included in a semiconductor device is not accurately executed, it may be difficult to guarantee the reliability of the semiconductor chip.

Recently, various test techniques of semiconductor devices have been developed. In particular, it may be very important to test the characteristics of a plurality of cells included in highly integrated semiconductor devices at a high speed together with a reliable test of the highly integrated semiconductor devices. Because a test time of the semiconductor devices directly influences manufacturing costs of the semiconductor devices with a development period of the semiconductor devices, reduction of the test time may act as an important issue in terms of production efficiency and competition in a worldwide semiconductor market. Thus, a parallel test has been proposed to reduce the testing time of semiconductor devices.

According to the parallel test, in a test mode, all banks in a semiconductor device may be enabled and one test pin may be allocated to each of the banks to compress and output all of the data in the banks. Thus, it may be possible to reduce the test time.

SUMMARY

According to one embodiment, a semiconductor device includes a row address generation circuit, a first region, and a second region. The row address generation circuit is configured to generate a first row address from an active signal and a first bank address and configured to generate a second row address from the active signal and a second bank address. The first region is activated by the first row address and an internal address. The second region is activated by the second row address and the internal address. One of the first and second bank addresses is selectively generated according to a command/address signal.

According to another embodiment, a semiconductor device includes a row address generation circuit, a memory region, and a compression circuit. The row address generation circuit is configured to generate a first row address and a second row address from a first bank address and a second bank address, one of the first row address and the second row address being selectively generated according to an active signal and a command/address signal. The memory region includes a first region and a second region. The memory region generates data from first internal data and second internal data stored in the first region and the second region, wherein the first region and the second region are activated by the first and second row addresses and an internal address. The compression circuit compares and compresses bit signals of the data to generate a comparison signal.

According to still another embodiment, a semiconductor device includes a row address generation circuit, a first memory region, and a second memory region. The row address generation circuit generates first, second, third, and fourth row addresses from first, second, third, and fourth bank addresses when an active signal is enabled. The first memory region outputs first and second internal data stored in first and second regions activated by the first and second row addresses and an internal address as data. The second memory region outputs third and fourth internal data stored in third and fourth regions activated by the third and fourth row addresses and the internal address as the data. One of the first and second bank addresses is selectively generated according to a command/address signal, and one of the third and fourth bank addresses is selectively generated according to the command/address signal.

BRIEF DESCRIPTION OF THE DRAWINGS

FIG. 2 is a table illustrating operations of an active signal generation circuit and a bank address generation circuit included in the semiconductor device of FIG. 1.

FIG. 11 is a table illustrating operations of an active signal generation circuit and a bank address generation circuit included in the semiconductor device of FIG. 10.

DETAILED DESCRIPTION OF THE EMBODIMENTS

Various embodiments of the present disclosure are described hereinafter with reference to the accompanying drawings. However, the embodiments described herein are for illustrative purposes only and are not intended to limit the scope of the present disclosure.

Figure 1:
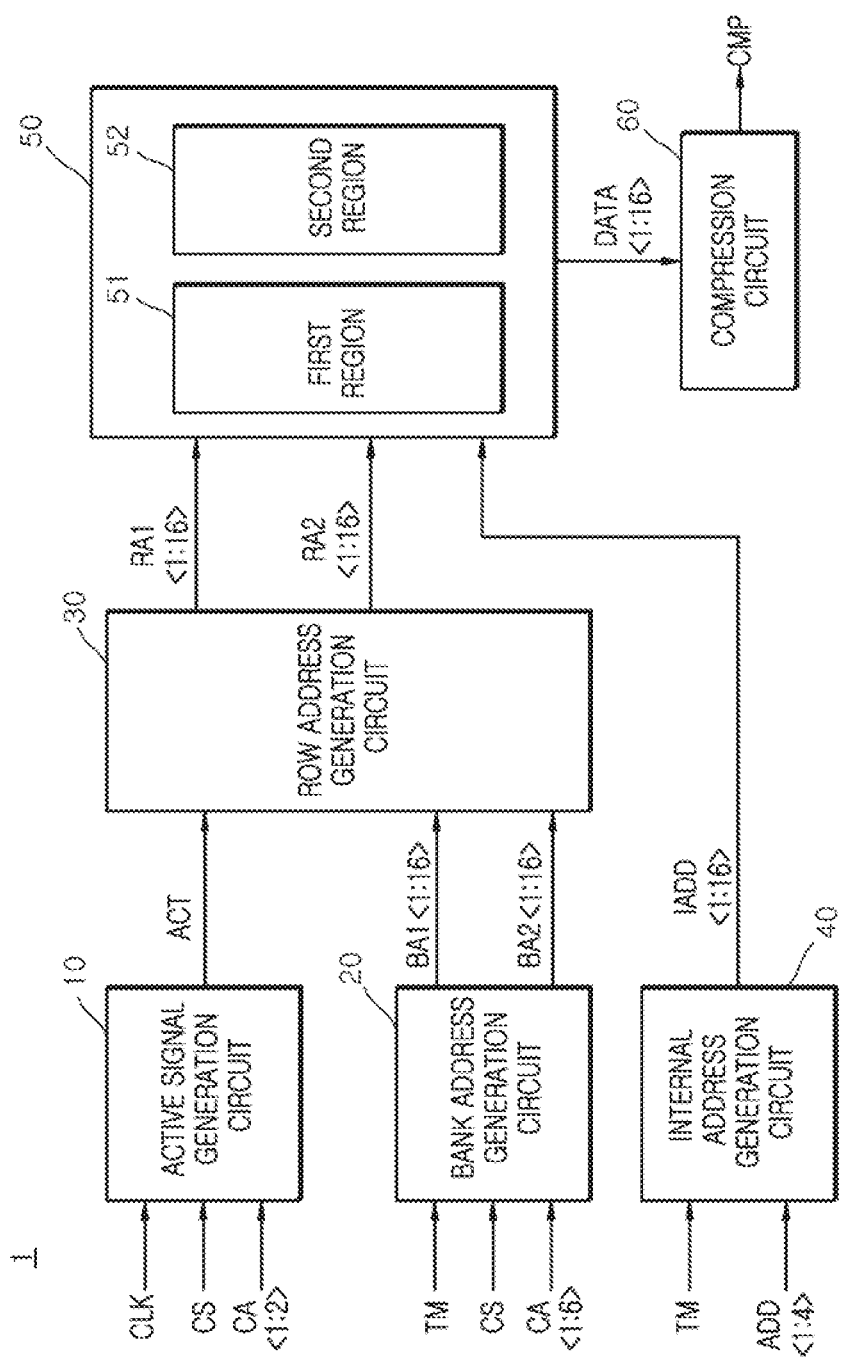
FIG. 1 is a block diagram illustrating a configuration of a semiconductor device according to an embodiment of the present disclosure.

As illustrated in FIG. 1, a semiconductor device 1 according to an embodiment may include an active signal generation circuit 10, a bank address generation circuit 20, a row address generation circuit 30, an internal address generation circuit 40, a memory region 50, and a compression circuit 60.

The active signal generation circuit 10 may be synchronized with a clock signal CLK to generate an active signal ACT from a chip selection signal CS and first and second command/address signals CA<1:2> of first to sixth command/address signals CA<1:6>. The active signal generation circuit 10 may be synchronized with the clock signal CLK to generate the active signal ACT, which is enabled when the chip selection signal CS and the first and second command/address signals CA<1:2> have a predetermined logic level combination. The active signal generation circuit 10 may be synchronized with the clock signal CLK to generate the active signal ACT, which is enabled after a predetermined time period elapses from a time when the chip selection signal CS and the first and second command/address signals CA<1:2> having a predetermined logic level combination are inputted to the active signal generation circuit 10. The predetermined time period for generating the active signal ACT may be set to be different according to the embodiments.

Logic levels of the chip selection signal CS and the first and second command/address signals CA<1:2> for generating the active signal ACT are described in detail with reference to FIG. 2 later.

The bank address generation circuit 20 may generate a first bank address BA1<1:16> from a test mode signal TM, the chip selection signal CS, and the first to sixth command/address signals CA<1:6>. The bank address generation circuit 20 may generate the first bank address BA1<1:16>, all of the bit signals of which are enabled by the chip selection signal CS and the first to sixth command/address signals CA<1:6> when the test mode signal TM is enabled. The bank address generation circuit 20 may generate the first bank address BA1<1:16>, a portion of the bit signals of which are selectively enabled by the chip selection signal CS and the first to sixth command/address signals CA<1:6> when the test mode signal TM is disabled.

The bank address generation circuit 20 may generate a second bank address BA2<1:16> from the test mode signal TM, the chip selection signal CS, and the first to sixth command/address signals CA<1:6>. The bank address generation circuit 20 may generate the second bank address BA2<1:16>, all of the bit signals of which are enabled by the chip selection signal CS and the first to sixth command/address signals CA<1:6> when the test mode signal TM is enabled. The bank address generation circuit 20 may generate the second bank address BA2<1:16>, a portion of the bit signals of which are selectively enabled by the chip selection signal CS and the first to sixth command/address signals CA<1:6> when the test mode signal TM is disabled.

Logic levels of the chip selection signal CS and the first to sixth command/address signals CA<1:6> for generating the first and second bank addresses BA1<1:16> and BA2<1:16> are described in detail with reference to FIG. 2 later. The test mode signal TM may be set as a signal which is enabled to perform a parallel test. The chip selection signal CS and the first to sixth command/address signals CA<1:6> may be provided by an external device.

The row address generation circuit 30 may generate a first row address RA1<1:16> from the first bank address BA1<1:16> when the active signal ACT is enabled. The row address generation circuit 30 may buffer the first bank address BA1<1:16> to generate the first row address RA1<1:16> when the active signal ACT is enabled.

The row address generation circuit 30 may generate a second row address RA2<1:16> from the second bank address BA2<1:16> when the active signal ACT is enabled. The row address generation circuit 30 may buffer the second bank address BA2<1:16> to generate the second row address RA2<1:16> when the active signal ACT is enabled.

The internal address generation circuit 40 may receive the test mode signal TM and an address ADD<1:4> to generate an internal address IADD<1:16>. The internal address generation circuit 40 may generate the internal address IADD<1:16> whose bit signals are sequentially enabled when the test mode signal TM is enabled. The internal address generation circuit 40 may decode the address ADD<1:4> to generate the internal address IADD<1:16>, a portion of the bit signals of which are selectively enabled when the test mode signal TM is disabled. The address ADD<1:4> may be provided by an external device.

The memory region 50 may include a first memory region, referred to as a first region 51, and a second memory region, referred to as a second region 52.

The first region 51 may be activated by the first row address RA1<1:16> and the internal address IADD<1:16> to generate data DATA<1:16>.

The second region 52 may be activated by the second row address RA2<1:16> and the internal address IADD<1:16> to generate the data DATA<1:16>.

The memory region 50 may be set as a bank including a plurality of word lines and a plurality of memory cells.

The compression circuit 60 may compare the data DATA<1:16> with each other and may compress the data DATA<1:16> to generate a comparison signal CMP. The compression circuit 60 may generate the comparison signal CMP which is enabled when bits included in the data DATA<1:16> have the same logic level. The compression circuit 60 may output the comparison signal CMP to an external test apparatus.

An operation of the active signal generation circuit 10 is described hereinafter with reference to FIG. 2.

The active signal generation circuit 10 may generate the active signal ACT, which is enabled to have a logic "high" level when the chip selection signal CS having a logic "low(L)" level, the first command/address signal CA<1> having a logic "low(L)" level, and the second command/address signal CA<2> having a logic "low(L)" level are inputted in synchronization with the clock signal CLK. Logic levels of the chip selection signal CS, the first command/address signal CA<1>, and the second command/address signal CA<2> for generating the active signal ACT may be set to be different according to the embodiments.

An operation of the bank address generation circuit 20 is described hereinafter with reference to FIG. 2.

The bank address generation circuit 20 may generate the first bank address BA1<1:16>, all of the bit signals of which are enabled according to logic levels of the third to sixth command/address signals CA<3:6> if the chip selection signal CS having a logic "low(L)" level is inputted after the first command/address signal CA<1> having a logic "high (H)" level is inputted while the chip selection signal CS has a logic "high(H)" level during a time period that the test mode signal TM is enabled. In such a case, all of the third to sixth command/address signals CA<3:6> may have a logic "high(H)" level or a logic "low(L)" level.

The bank address generation circuit 20 may generate the second bank address BA2<1:16>, all of the bit signals of which are enabled according to logic levels of the third to sixth command/address signals CA<3:6> if the chip selection signal CS having a logic "low(L)" level is inputted after the first command/address signal CA<1> having a logic "low(L)" level is inputted while the chip selection signal CS has a logic "high(H)" level during a time period that the test mode signal TM is enabled. In such a case, all of the third to sixth command/address signals CA<3:6> may have a logic "high(H)" level or a logic "low(L)" level.

The bank address generation circuit 20 may generate the first bank address BA1<1:16>, one of the bit signals of which is selectively enabled by decoding the third to sixth command/address signals CA<3:6> if the chip selection signal CS having a logic "low(L)" level is inputted after the first command/address signal CA<1> having a logic "high (H)" level is inputted while the chip selection signal CS has a logic "high(H)" level during a time period that the test mode signal TM is disabled.

The bank address generation circuit 20 may generate the second bank address BA2<1:16>, one of the bit signals of which is selectively enabled by decoding the third to sixth command/address signals CA<3:6> if the chip selection signal CS having a logic "low(L)" level is inputted after the first command/address signal CA<1> having a logic "low (L)" level is inputted while the chip selection signal CS has a logic "high(H)" level during a time period that the test mode signal TM is disabled.

Figure 3:
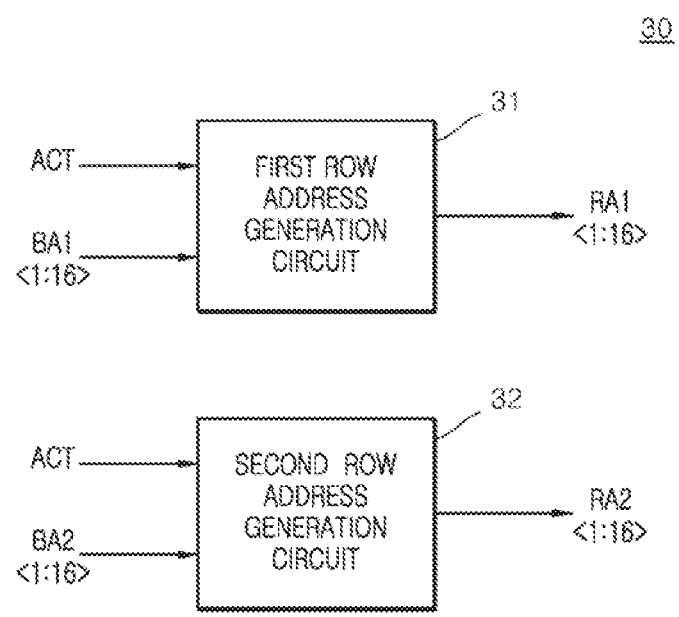
FIG. 3 is a block diagram illustrating a configuration of a row address generation circuit included in the semiconductor device of FIG. 1.

Referring to FIG. 3, the row address generation circuit 30 may include a first row address generation circuit 31 and a second row address generation circuit 32.

The first row address generation circuit 31 may generate the first row address RA1<1:16> from the first bank address BA1<1:16> when the active signal ACT is enabled. The first row address generation circuit 31 may buffer the first bank address BA1<1:16> to generate the first row address RA1<1:16> when the active signal ACT is enabled.

The second row address generation circuit 32 may generate the second row address RA2<1:16> from the second bank address BA2<1:16> when the active signal ACT is enabled. The second row address generation circuit 32 may buffer the second bank address BA2<1:16> to generate the second row address RA2<1:16> when the active signal ACT is enabled.

Figure 4:
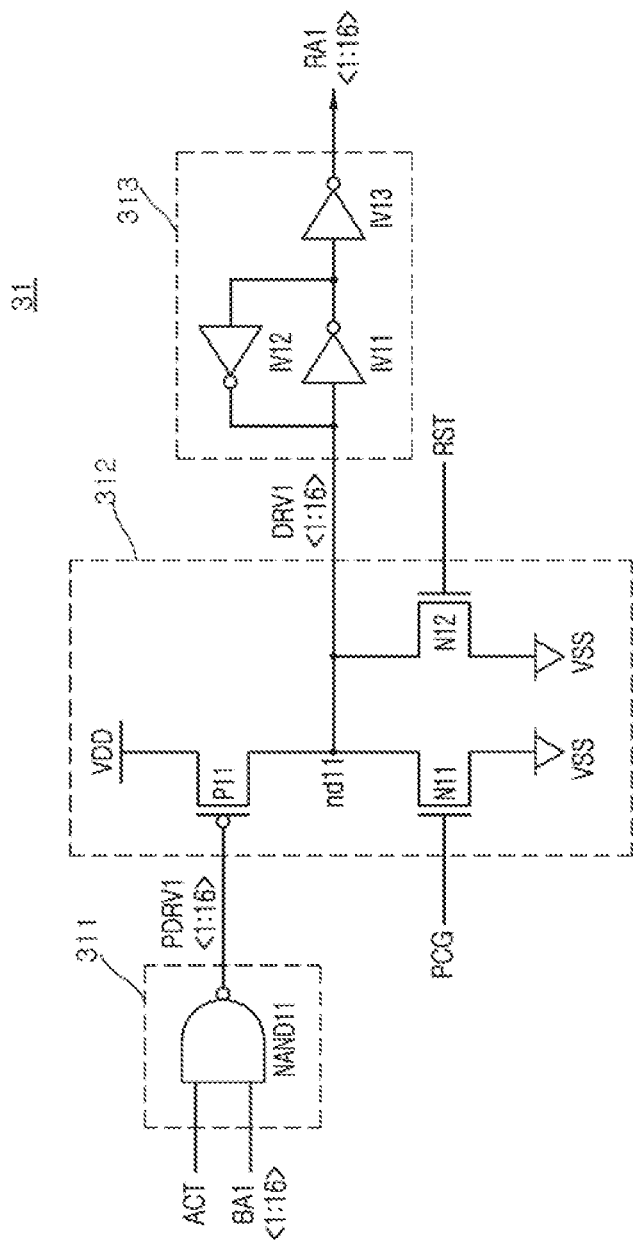
FIG. 4 is a circuit diagram illustrating a configuration of a first row address generation circuit included in the row address generation circuit of FIG. 3.

Referring to FIG. 4, the first row address generation circuit 31 may include a first pre-drive signal generation circuit 311, a first drive circuit 312, and a first latch circuit 313.

The first pre-drive signal generation circuit 311 may be realized using a NAND gate NAND11. The first pre-drive signal generation circuit 311 may inversely buffer the first bank address BA1<1:16> to generate a first pre-drive signal PDRV1<1:16> when the active signal ACT is enabled to have a logic "high(H)" level. The first pre-drive signal generation circuit 311 may perform a logical NAND operation of the active signal ACT and the first bank address BA1<1:16> to generate the first pre-drive signal PDRV1<1:16>.

The first drive circuit 312 may be realized to include a PMOS transistor P11 coupled between a power supply voltage VDD terminal and a node nd11 and tuned on by the first pre-drive signal PDRV1<1:16> to pull up the node nd11 to the power supply voltage VDD, an NMOS transistor N11 coupled between the node nd11 and a ground voltage VSS terminal and turned on by a pre-charge signal PCG to pull down the node nd11 to the ground voltage VSS, and an NMOS transistor N12 coupled between the node nd11 and the ground voltage VSS terminal and turned on by a reset signal RST to pull down the node nd11 to the ground voltage VSS. The first drive circuit 312 may pull up the node nd11 to generate a first drive signal DRV1<1:16> having a logic "high" level when the first pre-drive signal PDRV1<1:16> is enabled to have a logic "low" level. The first drive circuit 312 may pull down the node nd11 to generate the first drive signal DRV1<1:16> having a logic "low" level when the pre-charge signal PCG is enabled to have a logic "high" level. The first drive circuit 312 may pull down the node nd11 to generate the first drive signal DRV1<1:16> having a logic "low" level when the reset signal RST is enabled to have a logic "high" level. The pre-charge signal PCG may be set as a signal which is enabled to perform a pre-charge operation after an activation operation. The reset signal RST may be set as a signal which is enabled to perform an initialization operation.

The first latch circuit 313 may be realized using inverters IV11, IV12, and IV13. The first latch circuit 313 may latch the first drive signal DRV1<1:16>. The first latch circuit 313 may buffer the latched signal of the first drive signal DRV1<1:16> to generate the first row address RA1<1:16>.

Meanwhile, although FIG. 4 illustrates the first row address generation circuit 31 with a single circuit including the first pre-drive signal generation circuit 311, the first drive circuit 312, and the first latch circuit 313, the first row address generation circuit 31 may be realized using 16 circuits, each of which has the same configuration as the circuit illustrated in FIG. 4. In such a case, each of the 16 circuits constituting the first row address generation circuit 31 may receive any one of the bits included in the first bank address BA1<1:16> and the active signal ACT and may output any one of the bits included in the first row address RA1<1:16>.

Figure 5:
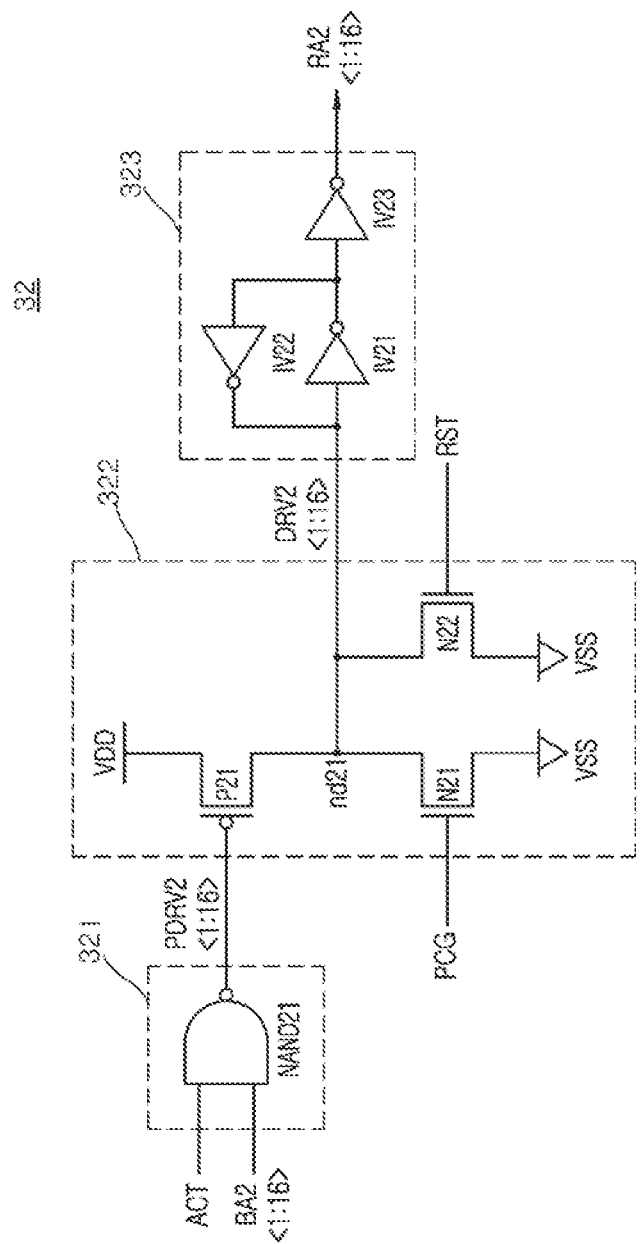
FIG. 5 is a circuit diagram illustrating a configuration of a second row address generation circuit included in the row address generation circuit of FIG. 3.

Referring to FIG. 5, the second row address generation circuit 32 may include a second pre-drive signal generation circuit 321, a second drive circuit 322, and a second latch circuit 323.

The second pre-drive signal generation circuit 321 may be realized using a NAND gate NAND21. The second pre-drive signal generation circuit 321 may inversely buffer the second bank address BA2<1:16> to generate a second pre-drive signal PDRV2<1:16> when the active signal ACT is enabled to have a logic "high(H)" level. The second pre-drive signal generation circuit 321 may perform a logical NAND operation of the active signal ACT and the second bank address BA2<1:16> to generate the second pre-drive signal PDRV2<1:16>.

The second drive circuit 322 may be realized to include a PMOS transistor P21 coupled between the power supply voltage VDD terminal and a node nd21 and tuned on by the second pre-drive signal PDRV2<1:16> to pull up the node nd21 to the power supply voltage VDD, an NMOS transistor N21 coupled between the node nd21 and the ground voltage VSS terminal and turned on by the pre-charge signal PCG to pull down the node nd21 to the ground voltage VSS, and an NMOS transistor N22 coupled between the node nd21 and the ground voltage VSS terminal and turned on by the reset signal RST to pull down the node nd21 to the ground voltage VSS. The second drive circuit 322 may pull up the node nd21 to generate a second drive signal DRV2<1:16> having a logic "high" level when the second pre-drive signal PDRV2<1:16> is enabled to have a logic "low" level. The second drive circuit 322 may pull down the node nd21 to generate the second drive signal DRV2<1:16> having a logic "low" level when the pre-charge signal PCG is enabled to have a logic "high" level. The second drive circuit 322 may pull down the node nd21 to generate the second drive signal DRV2<1:16> having a logic "low" level when the reset signal RST is enabled to have a logic "high" level.

The second latch circuit 323 may be realized using inverters IV21, IV22, and IV23. The second latch circuit 323 may latch the second drive signal DRV2<1:16>. The second latch circuit 323 may buffer the latched signal of the second drive signal DRV2<1:16> to generate the second row address RA2<1:16>.

Meanwhile, although FIG. 5 illustrates the second row address generation circuit 32 with a single circuit including the second pre-drive signal generation circuit 321, the second drive circuit 322, and the second latch circuit 323, the second row address generation circuit 32 may be realized using 16 circuits, each of which has the same configuration as the circuit illustrated in FIG. 5. In such a case, each of the 16 circuits constituting the second row address generation circuit 32 may receive any one of the bits included in the second bank address BA2<1:16> and the active signal ACT and may output any one of the bits included in the second row address RA2<1:16>.

Figure 6:
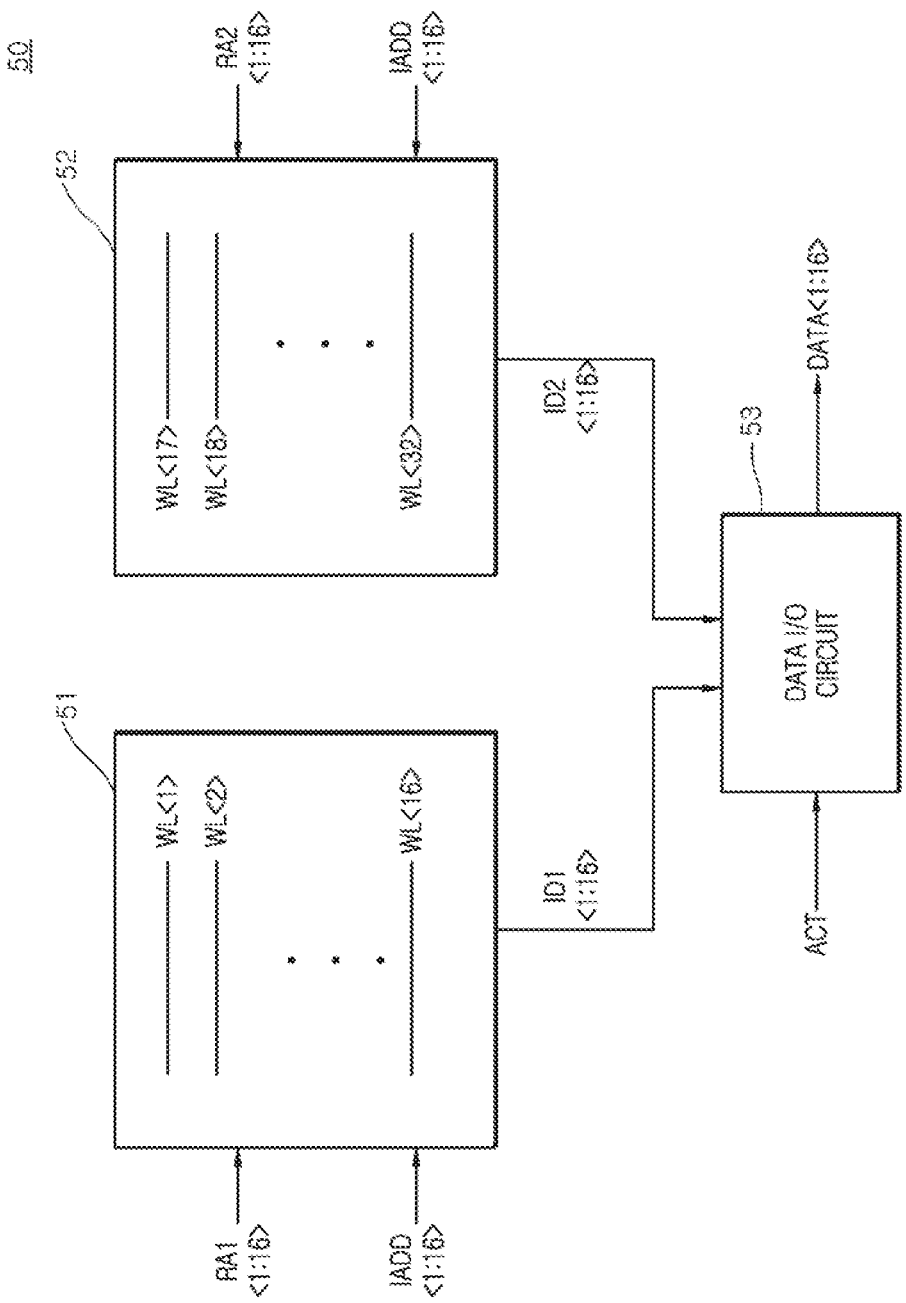
FIG. 6 is a block diagram illustrating a configuration of a memory region included in the semiconductor device of FIG. 1.

Referring to FIG. 6, the memory region 50 may include the first region 51, the second region 52, and a data I/O circuit 53.

The first region 51 may include first to sixteenth word lines WL<1:16>, one of which is activated by the first row address RA1<1:16>. The first region 51 may generate first internal data ID1<1:16> from at least one memory cell (not shown) connected to one of the first to sixteenth word lines WL<1:16>, which is activated by the first row address RA1<1:16> and the internal address IADD<1:16>. The number of the word lines included in the first region 51 may be set to be different according to the embodiments.

The second region 52 may include seventeenth to thirty second word lines WL<17:32>, one of which is activated by the second row address RA2<1:16>. The second region 52 may generate second internal data ID2<1:16> from at least one memory cell (not shown) connected to one of the seventh to thirty second word lines WL<17:32>, which is activated by the second row address RA2<1:16> and the internal address IADD<1:16>. The number of the word lines included in the second region 52 may be set to be different according to the embodiments.

The data I/O circuit 53 may generate the data DATA<1: 16> from the first internal data ID1<1:16> when the active signal ACT is enabled. The data I/O circuit 53 may generate the data DATA<1:16> from the second internal data ID2<1: 16> when the active signal ACT is enabled.

Figure 7:
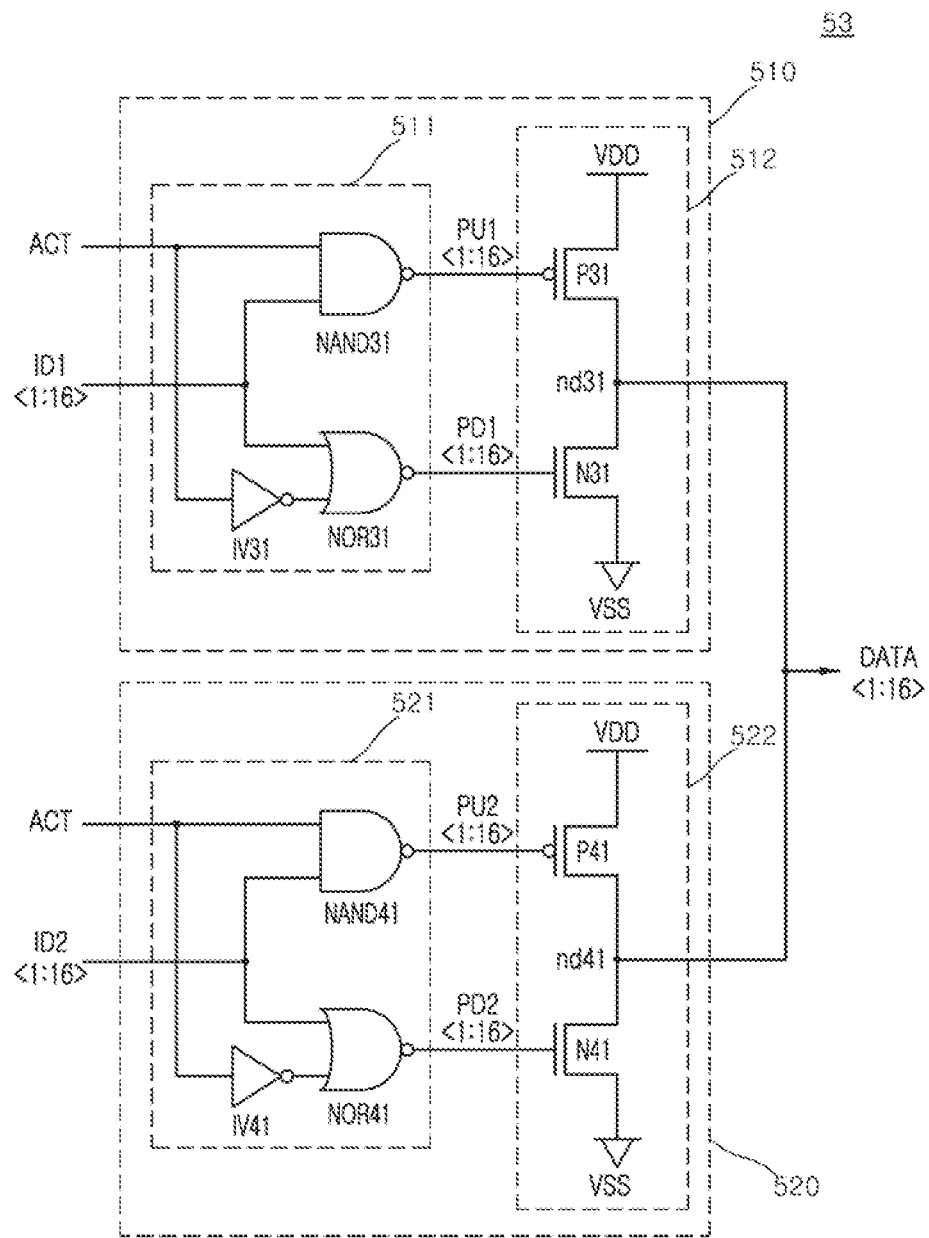
FIG. 7 is a circuit diagram illustrating a configuration of a data input/output (I/O) circuit included in the memory region of FIG. 6.

Referring to FIG. 7, the data I/O circuit 53 may include a first data I/O circuit 510 and a second data I/O circuit 520.

The first data I/O circuit 510 may include a first pull-up/pull-down signal generation circuit 511 and a third drive circuit 512.

The first pull-up/pull-down signal generation circuit 511 may be realized using an inverter IV31, a NAND gate NAND31, and a NOR gate NOR31. The first pull-up/pull-down signal generation circuit 511 may inversely buffer the first internal data ID1<1:16> to generate a first pull-up signal PU1<1:16> when the active signal ACT is enabled to have a logic "high" level. The first pull-up/pull-down signal generation circuit 511 may inversely buffer the first internal data ID1<1:16> to generate a first pull-down signal PD1<1: 16> when the active signal ACT is enabled to have a logic "high" level.

The third drive circuit 512 may be configured to include a PMOS transistor P31 coupled between the power supply voltage VDD terminal and a node nd31 and turned on by the first pull-up signal PU1<1:16> to pull up the node nd31 to the power supply voltage VDD and an NMOS transistor N31 coupled between the node nd31 and the ground voltage VSS terminal and turned on by the first pull-down signal PD1<1: 16> to pull down the node nd31 to the ground voltage VSS. The third drive circuit 512 may pull up the node nd31 to generate the data DATA<1:16> having a logic "high" level when the first pull-up signal PU1<1:16> is enabled to have a logic "low" level. The third drive circuit 512 may pull down the node nd31 to generate the data DATA<1:16> having a logic "low" level when the first pull-down signal PD1<1:16> is enabled to have a logic "high" level.

The second data I/O circuit 520 may include a second pull-up/pull-down signal generation circuit 521 and a fourth drive circuit 522.

The second pull-up/pull-down signal generation circuit 521 may be realized using an inverter IV41, a NAND gate NAND41, and a NOR gate NOR41. The second pull-up/pull-down signal generation circuit 521 may inversely buffer the second internal data ID2<1:16> to generate a second pull-up signal PU2<1:16> when the active signal ACT is enabled to have a logic "high" level. The second pull-up/pull-down signal generation circuit 521 may inversely buffer the second internal data ID2<1:16> to generate a second pull-down signal PD2<1:16> when the active signal ACT is enabled to have a logic "high" level.

The fourth drive circuit 522 may be configured to include a PMOS transistor P41 coupled between the power supply voltage VDD terminal and a node nd41 and turned on by the second pull-up signal PU2<1:16> to pull up the node nd41 to the power supply voltage VDD and an NMOS transistor N41 coupled between the node nd41 and the ground voltage VSS terminal and turned on by the second pull-down signal PD2<1:16> to pull down the node nd41 to the ground voltage VSS. The fourth drive circuit 522 may pull up the node nd41 to generate the data DATA<1:16> having a logic "high" level when the second pull-up signal PU2<1:16> is enabled to have a logic "low" level. The fourth drive circuit 522 may pull down the node nd41 to generate the data DATA<1:16> having a logic "low" level when the second pull-down signal PD2<1:16> is enabled to have a logic "high" level.

Meanwhile, although FIG. 7 illustrates the data I/O circuit 53 with a single circuit including the first and second data I/O circuits 510 and 520, the data I/O circuit 53 may be realized using 16 circuits, each of which has the same configuration as the circuit illustrated in FIG. 7. In such a case, each of the 16 circuits may receive any one of the bits included in the first internal data ID1<1:16> and any one of the bits included in the second internal data ID2<1:16> and may output any one of the bits included in the data DATA<1: 16>.

Figure 8:
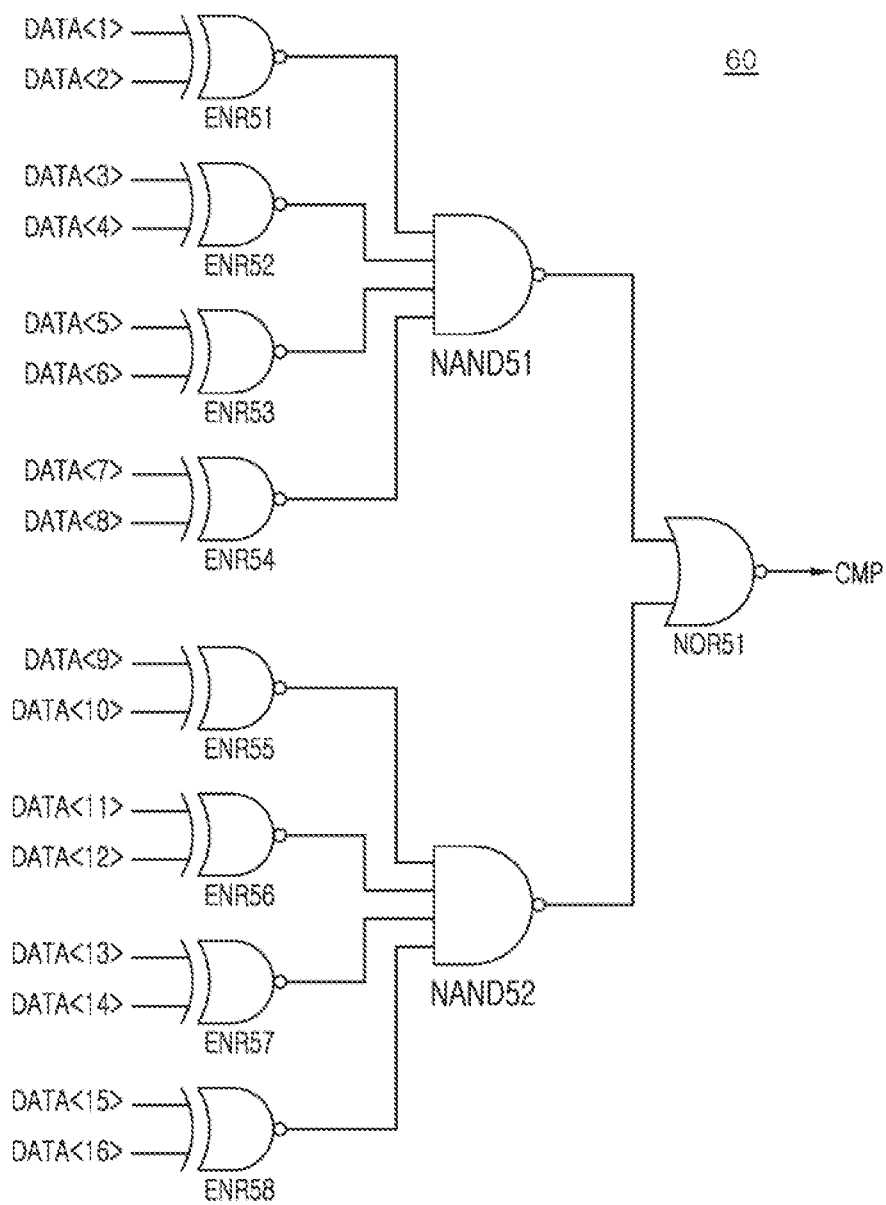
FIG. 8 is a circuit diagram illustrating a configuration of a compression circuit included in the semiconductor device of FIG. 1.

Referring to FIG. 8, the compression circuit 60 may be realized using exclusive NOR gates ENR51, ENR52, ENR53, ENR54, ENR55, ENR56, ENR57 and ENR58, NAND gates NAND51 and NAND52, and a NOR gate NOR51.

The compression circuit 60 may compare logic levels of the bits included in the data DATA<1:16> with each other and may compress the comparison results to generate the comparison signal CMP. The compression circuit 60 may generate the comparison signal CMP having a logic "high" level when all of the bits included in the data DATA<1:16> have the same logic level. The compression circuit 60 may generate the comparison signal CMP having a logic "low" level when a pair of data bits inputted to at least one of the exclusive NOR gates ENR51, ENR52, ENR53, ENR54, ENR55, ENR56, ENR57 and ENR58 have different logic levels.

Figure 9:
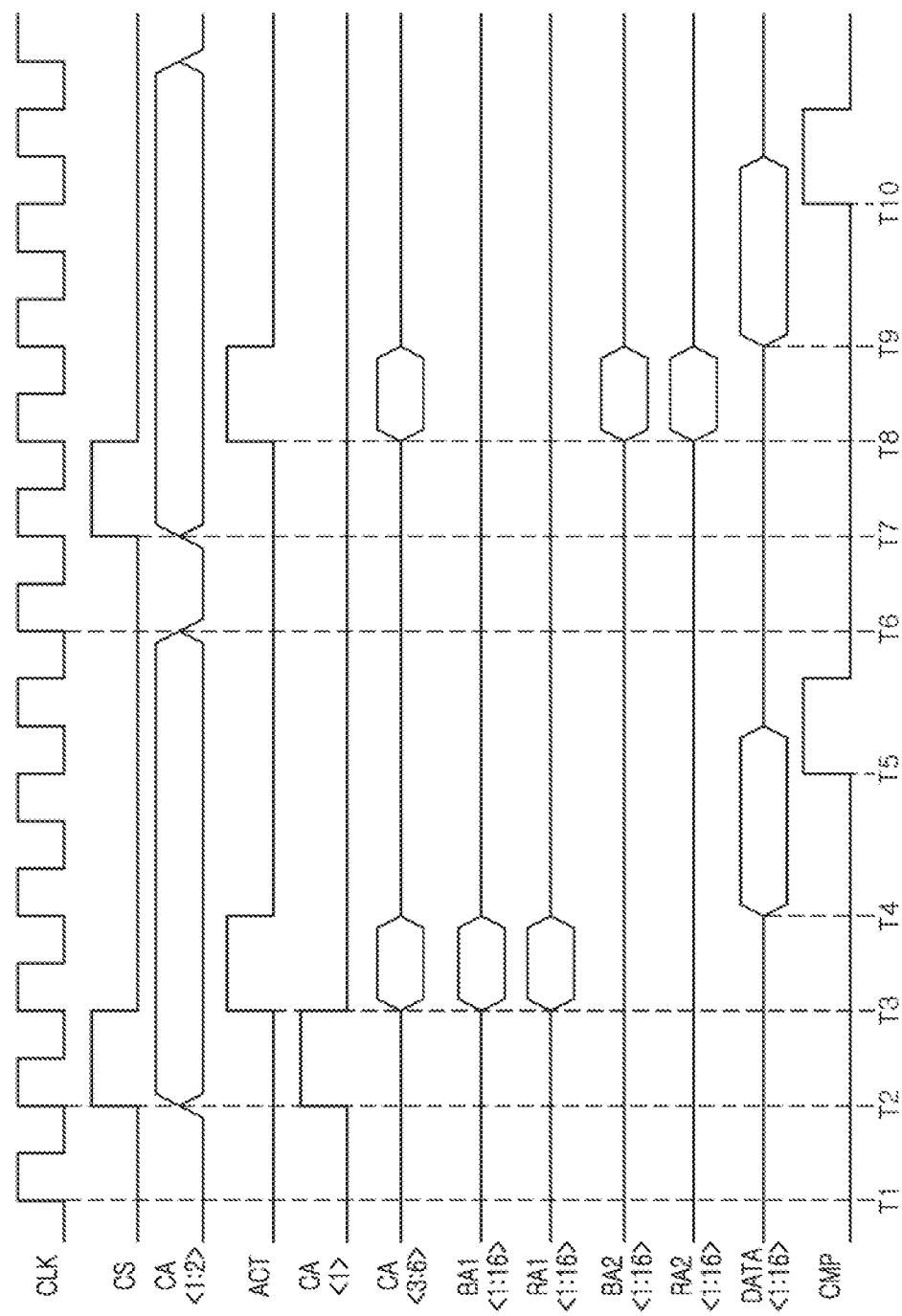
FIG. 9 is a timing diagram illustrating a test mode of a semiconductor device according to an embodiment of the present disclosure.

A test mode of the semiconductor device 1 according to an embodiment is described hereinafter with reference to FIG. 9.

At a time "T1", the chip selection signal CS having a logic "low" level and the first and second command/address signals CA<1:2> having a logic "low" level may be inputted to the active signal generation circuit 10 in synchronization with the clock signal CLK.

At a time "T2", the chip selection signal CS having a logic "high" level and the first command/address signal CA<1> having a logic "high" level may be inputted to the active signal generation circuit 10 in synchronization with the clock signal CLK.

At a time "T3", the active signal generation circuit 10 may generate the active signal ACT having a logic "high" level based on the chip selection signal CS having a logic "low" level and the first and second command/address signals CA<1:2> having a logic "low" level which are inputted in synchronization with the clock signal CLK at the time "T1".

The bank address generation circuit 20 may generate the first bank address BA1<1:16> based on the chip selection signal CS having a logic "high" level and the first command/address signal CA<1> having a logic "high" level which are inputted in synchronization with the clock signal CLK at the time "T2" and the third to sixth command/address signals CA<3:6> which are inputted in synchronization with the clock signal CLK at the time "T3". In such a case, all of the bits included in the first bank address BA1<1:16> may be enabled to have a logic "high" level.

The first row address generation circuit 31 may generate the first row address RA1<1:16> from the first bank address BA1<1:16> based on the active signal ACT having a logic "high" level.

From a time "T4", the first region 51 of the memory region 50 may be activated by the first row address RA1<1:16> and the internal address IADD<1:16> to generate the data DATA<1:16>.

At a time "T5", the compression circuit 60 may generate the comparison signal CMP which is enabled to have a logic "high" level when all of the bits included in the data DATA<1:16> have the same logic level. The compression circuit 60 may output the comparison signal CMP to an external test apparatus. The comparison signal CMP enabled to have a logic "high" level means that all of memory cells (not shown) included in the first region 51 are normal memory cells without any failed cell.

At a time "T6", the chip selection signal CS having a logic "low" level and the first and second command/address signals CA<1:2> having a logic "low" level may be inputted to the active signal generation circuit 10 in synchronization with the clock signal CLK.

At a time "T7", the chip selection signal CS having a logic "high" level and the first command/address signal CA<1> having a logic "low" level may be inputted to the active signal generation circuit 10 in synchronization with the clock signal CLK.

At a time "T8", the active signal generation circuit 10 may generate the active signal ACT having a logic "high" level based on the chip selection signal CS having a logic "low" level and the first and second command/address signals CA<1:2> having a logic "low" level which are inputted in synchronization with the clock signal CLK at the time "T6".

The bank address generation circuit 20 may generate the second bank address BA2<1:16> based on the chip selection signal CS having a logic "high" level and the first command/address signal CA<1> having a logic "low" level which are inputted in synchronization with the clock signal CLK at the time "T7" and the third to sixth command/address signals CA<3:6> which are inputted in synchronization with the clock signal CLK at the time "T8". In such a case, all of the bits included in the second bank address BA2<1:16> may be enabled to have a logic "high" level.

The second row address generation circuit 32 may generate the second row address RA2<1:16> from the second bank address BA2<1:16> based on the active signal ACT having a logic "high" level.

From a time "T9", the second region 52 of the memory region 50 may be activated by the second row address RA2<1:16> and the internal address IADD<1:16> to generate the data DATA<1:16>.

At a time "T10", the compression circuit 60 may generate the comparison signal CMP which is enabled to have a logic "high" level when all of the bits included in the data DATA<1:16> have the same logic level. The compression circuit 60 may output the comparison signal CMP to an external test apparatus. The comparison signal CMP enabled to have a logic "high" level means that all of memory cells (not shown) included in the second region 52 are normal memory cells without any failed cell.

As described above, a semiconductor device according to an embodiment may be designed to divide a memory region into a plurality of regions, may generate a plurality of row addresses corresponding to respective ones of the plurality of regions included in the memory region, and may provide a test mode for performing a compressive test of data generated by activating the plurality of regions allocated by the plurality of row addresses to reduce a test time.

Figure 10:
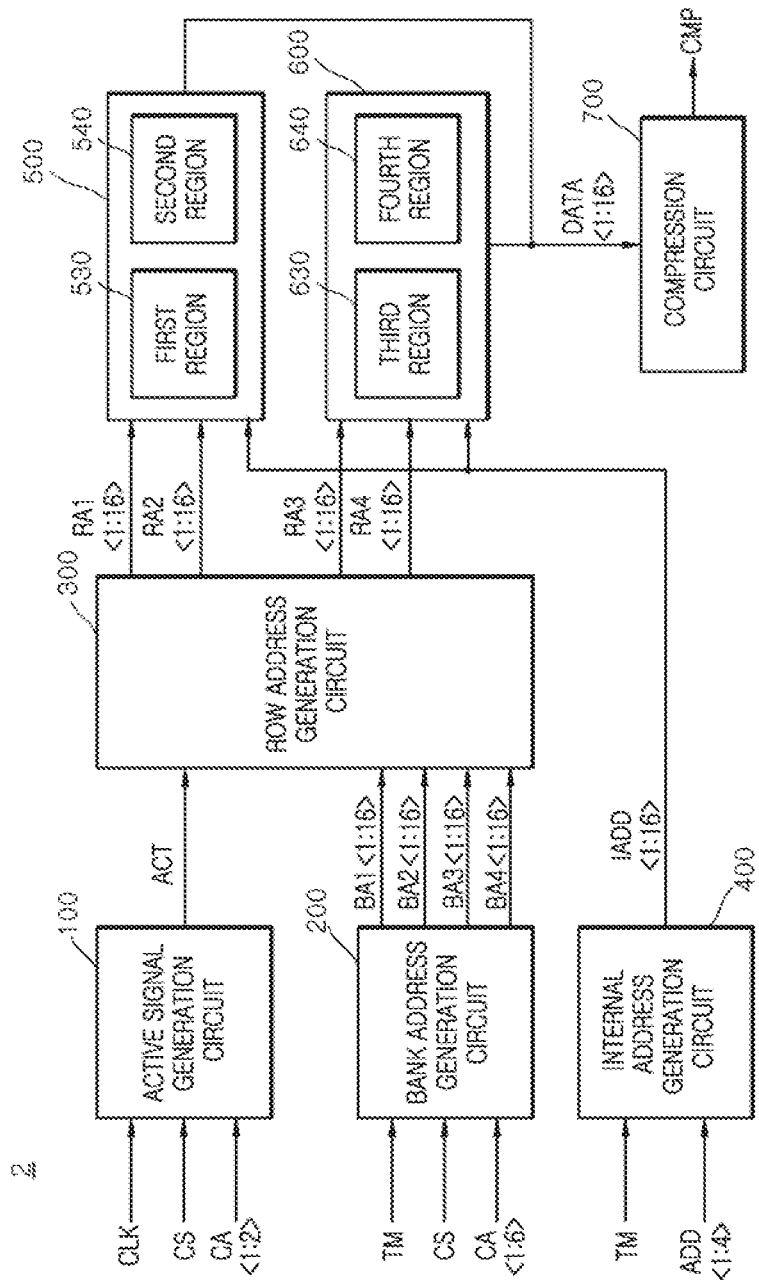
FIG. 10 is a block diagram illustrating a configuration of a semiconductor device according to another embodiment of the present disclosure.

FIG. 10 is a block diagram illustrating a configuration of a semiconductor device 2 according to another embodiment of the present disclosure.

As illustrated in FIG. 10, the semiconductor device 2 may include an active signal generation circuit 100, a bank address generation circuit 200, a row address generation circuit 300, an internal address generation circuit 400, a first memory region 500, a second memory region 600, and a compression circuit 700.

The active signal generation circuit 100 may be synchronized with a clock signal CLK to generate an active signal ACT from a chip selection signal CS and first and second command/address signals CA<1:2> of first to sixth command/address signals CA<1:6>. The active signal generation circuit 100 may be synchronized with the clock signal CLK to generate the active signal ACT which is enabled when the chip selection signal CS and the first and second command/address signals CA<1:2> have a predetermined logic level combination. Logic levels of the chip selection signal CS and the first and second command/address signals CA<1:2> for generating the active signal ACT are described in detail with reference to FIG. 11 later.

The bank address generation circuit 200 may generate a first bank address BA1<1:16> from a test mode signal TM, the chip selection signal CS, and the first to sixth command/address signals CA<1:6>. The bank address generation circuit 200 may generate the first bank address BA1<1:16>, all of the bit signals of which are enabled by the chip selection signal CS and the first to sixth command/address signals CA<1:6> when the test mode signal TM is enabled. The bank address generation circuit 200 may generate the first bank address BA1<1:16>, a portion of the bit signals of which are selectively enabled by the chip selection signal CS and the first to sixth command/address signals CA<1:6> when the test mode signal TM is disabled.

The bank address generation circuit 200 may generate a second bank address BA2<1:16> from the test mode signal TM, the chip selection signal CS, and the first to sixth command/address signals CA<1:6>. The bank address generation circuit 200 may generate the second bank address BA2<1:16>, all of the bit signals of which are enabled by the chip selection signal CS and the first to sixth command/address signals CA<1:6> when the test mode signal TM is enabled. The bank address generation circuit 200 may generate the second bank address BA2<1:16>, a portion of the bit signals of which are selectively enabled by the chip selection signal CS and the first to sixth command/address signals CA<1:6> when the test mode signal TM is disabled.

The bank address generation circuit 200 may generate a third bank address BA3<1:16> from the test mode signal TM, the chip selection signal CS, and the first to sixth command/address signals CA<1:6>. The bank address generation circuit 200 may generate the third bank address BA3<1:16>, all of the bit signals of which are enabled by the chip selection signal CS and the first to sixth command/address signals CA<1:6> when the test mode signal TM is enabled. The bank address generation circuit 200 may generate the third bank address BA3<1:16>, a portion of the bit signals of which are selectively enabled by the chip selection signal CS and the first to sixth command/address signals CA<1:6> when the test mode signal TM is disabled.

The bank address generation circuit 200 may generate a fourth bank address BA4<1:16> from the test mode signal TM, the chip selection signal CS, and the first to sixth command/address signals CA<1:6>. The bank address generation circuit 200 may generate the fourth bank address BA4<1:16>, all of the bit signals of which are enabled by the chip selection signal CS and the first to sixth command/address signals CA<1:6> when the test mode signal TM is enabled. The bank address generation circuit 200 may generate the fourth bank address BA4<1:16>, a portion of the bit signals of which are selectively enabled by the chip selection signal CS and the first to sixth command/address signals CA<1:6> when the test mode signal TM is disabled.

Logic levels of the chip selection signal CS and the first to sixth command/address signals CA<1:6> for generating the first to fourth bank addresses BA1<1:16>, BA2<1:16>, BA3<1:16>, and BA4<1:16> are described in detail with reference to FIG. 11 later.

The row address generation circuit 300 may generate a first row address RA1<1:16> from the first bank address BA1<1:16> when the active signal ACT is enabled. The row address generation circuit 300 may buffer the first bank address BA1<1:16> to generate the first row address RA1<1:16> when the active signal ACT is enabled.

The row address generation circuit 300 may generate a second row address RA2<1:16> from the second bank address BA2<1:16> when the active signal ACT is enabled. The row address generation circuit 300 may buffer the second bank address BA2<1:16> to generate the second row address RA2<1:16> when the active signal ACT is enabled.

The row address generation circuit 300 may generate a third row address RA3<1:16> from the third bank address BA3<1:16> when the active signal ACT is enabled. The row address generation circuit 300 may buffer the third bank address BA3<1:16> to generate the third row address RA3<1:16> when the active signal ACT is enabled.

The row address generation circuit 300 may generate a fourth row address RA4<1:16> from the fourth bank address BA4<1:16> when the active signal ACT is enabled. The row address generation circuit 300 may buffer the fourth bank address BA4<1:16> to generate the fourth row address RA4<1:16> when the active signal ACT is enabled.

Meanwhile, the row address generation circuit 300 illustrated in FIG. 10 may be realized to have substantially the same configuration as the row address generation circuit 30 illustrated in FIGS. 3 to 5 except for the number of I/O signals thereof. Thus, detailed descriptions of the row address generation circuit 300 are omitted hereinafter.

The internal address generation circuit 400 may receive the test mode signal TM and an address ADD<1:4> to generate an internal address IADD<1:16>. The internal address generation circuit 400 may generate the internal address IADD<1:16> whose bit signals are sequentially enabled when the test mode signal TM is enabled. The internal address generation circuit 400 may decode the address ADD<1:4> to generate the internal address IADD<1:16>, a portion of the bit signals of which are selectively enabled when the test mode signal TM is disabled.

The first memory region 500 may include a first memory sub-region 530 and a second memory sub-region 540. The first memory sub-region 530 may be activated by the first row address RA1<1:16> and the internal address IADD<1:16> to generate data DATA<1:16>. The second memory sub-region 540 may be activated by the second row address RA2<1:16> and the internal address IADD<1:16> to generate the data DATA<1:16>. Meanwhile, the first memory region 500 may be realized to have the same circuit as the memory region 50 illustrated in FIGS. 6 and 7. Thus, detailed descriptions of the first memory region 500 are omitted hereinafter.

The second memory region 600 may include a third memory sub-region 630 and a fourth memory sub-region 640. The third memory sub-region 630 may be activated by the third row address RA3<1:16> and the internal address IADD<1:16> to generate the data DATA<1:16>. The fourth memory sub-region 640 may be activated by the fourth row address RA4<1:16> and the internal address IADD<1:16> to generate the data DATA<1:16>. Meanwhile, the second memory region 600 may be realized to have the same circuit as the memory region 50 illustrated in FIGS. 6 and 7. Thus, detailed descriptions of the second memory region 600 are omitted hereinafter.

The compression circuit 700 may compare the data DATA<1:16> with each other and may compress the data DATA<1:16> to generate a comparison signal CMP. The compression circuit 700 may generate the comparison signal CMP which is enabled when bits included in the data DATA<1:16> have the same logic level. The compression circuit 700 may output the comparison signal CMP to an external test apparatus. Meanwhile, the compression circuit 700 may be realized to have the same configuration as the compression circuit 60 illustrated in FIG. 8. Thus, detailed descriptions of the compression circuit 700 are omitted hereinafter.

An operation of the active signal generation circuit 100 is described hereinafter with reference to FIG. 11.

The active signal generation circuit 100 may generate the active signal ACT which is enabled to have a logic "high" level when the chip selection signal CS having a logic "low(L)" level, the first command/address signal CA<1> having a logic "low(L)" level, and the second command/address signal CA<2> having a logic "low(L)" level are inputted in synchronization with the clock signal CLK. Logic levels of the chip selection signal CS, the first command/address signal CA<1>, and the second command/address signal CA<2> for generating the active signal ACT may be set to be different according to the embodiments.

An operation of the bank address generation circuit 200 is described hereinafter with reference to FIG. 11.

The bank address generation circuit 200 may generate the first bank address BA1<1:16>, all of the bit signals of which are enabled according to logic levels of the third to sixth command/address signals CA<3:6> if the chip selection signal CS having a logic "low(L)" level is inputted after the first command/address signal CA<1> having a logic "high (H)" level and the second command/address signal CA<2> having a logic "low(L)" level are inputted while the chip selection signal CS has a logic "high(H)" level during a time period that the test mode signal TM is enabled. In such a case, all of the third to sixth command/address signals CA<3:6> may have a logic "high(H)" level or a logic "low(L)" level.

The bank address generation circuit 200 may generate the second bank address BA2<1:16>, all of the bit signals of which are enabled according to logic levels of the third to sixth command/address signals CA<3:6> if the chip selection signal CS having a logic "low(L)" level is inputted after the first command/address signal CA<1> having a logic "low(L)" level and the second command/address signal CA<2> having a logic "low(L)" level are inputted while the chip selection signal CS has a logic "high(H)" level during a time period that the test mode signal TM is enabled. In such a case, all of the third to sixth command/address signals CA<3:6> may have a logic "high(H)" level or a logic "low(L)" level.

The bank address generation circuit 200 may generate the third bank address BA3<1:16>, all of the bit signals of which are enabled according to logic levels of the third to sixth command/address signals CA<3:6> if the chip selection signal CS having a logic "low(L)" level is inputted after the first command/address signal CA<1> having a logic "high(H)" level and the second command/address signal CA<2> having a logic "high(H)" level are inputted while the chip selection signal CS has a logic "high(H)" level during a time period that the test mode signal TM is enabled. In such a case, all of the third to sixth command/address signals CA<3:6> may have a logic "high(H)" level or a logic "low(L)" level.

The bank address generation circuit 200 may generate the fourth bank address BA4<1:16>, all of the bit signals of which are enabled according to logic levels of the third to sixth command/address signals CA<3:6> if the chip selection signal CS having a logic "low(L)" level is inputted after the first command/address signal CA<1> having a logic "low(L)" level and the second command/address signal CA<2> having a logic "high(H)" level are inputted while the chip selection signal CS has a logic "high(H)" level during a time period that the test mode signal TM is enabled. In such a case, all of the third to sixth command/address signals CA<3:6> may have a logic "high(H)" level or a logic "low(L)" level.

The bank address generation circuit 200 may generate the first bank address BA1<1:16>, one of the bit signals of which is selectively enabled by decoding the third to sixth command/address signals CA<3:6> if the chip selection signal CS having a logic "low(L)" level is inputted after the first command/address signal CA<1> having a logic "high (H)" level and the second command/address signal CA<2> having a logic "low(L)" level are inputted while the chip selection signal CS has a logic "high(H)" level during a time period that the test mode signal TM is disabled.

The bank address generation circuit 200 may generate the second bank address BA2<1:16>, one of the bit signals of which is selectively enabled by decoding the third to sixth command/address signals CA<3:6> if the chip selection signal CS having a logic "low(L)" level is inputted after the first command/address signal CA<1> having a logic "low (L)" level and the second command/address signal CA<2> having a logic "low(L)" level are inputted while the chip selection signal CS has a logic "high(H)" level during a time period that the test mode signal TM is disabled.

The bank address generation circuit 200 may generate the third bank address BA3<1:16>, one of the bit signals of which is selectively enabled by decoding the third to sixth command/address signals CA<3:6> if the chip selection signal CS having a logic "low(L)" level is inputted after the first command/address signal CA<1> having a logic "high (H)" level and the second command/address signal CA<2> having a logic "high(H)" level are inputted while the chip selection signal CS has a logic "high(H)" level during a time period that the test mode signal TM is disabled.

The bank address generation circuit 200 may generate the fourth bank address BA4<1:16>, one of the bit signals of which is selectively enabled by decoding the third to sixth command/address signals CA<3:6> if the chip selection signal CS having a logic "low(L)" level is inputted after the first command/address signal CA<1> having a logic "low (L)" level and the second command/address signal CA<2> having a logic "high(H)" level are inputted while the chip selection signal CS has a logic "high(H)" level during a time period that the test mode signal TM is disabled.

As described above, a semiconductor device according to another embodiment may be designed to divide a memory region into a plurality of regions, may generate a plurality of row addresses corresponding to respective ones of the plurality of regions included in the memory region, and may provide a test mode for performing a compressive test of data generated by activating the plurality of regions allocated by the plurality of row addresses to reduce a test time.

Figure 12:
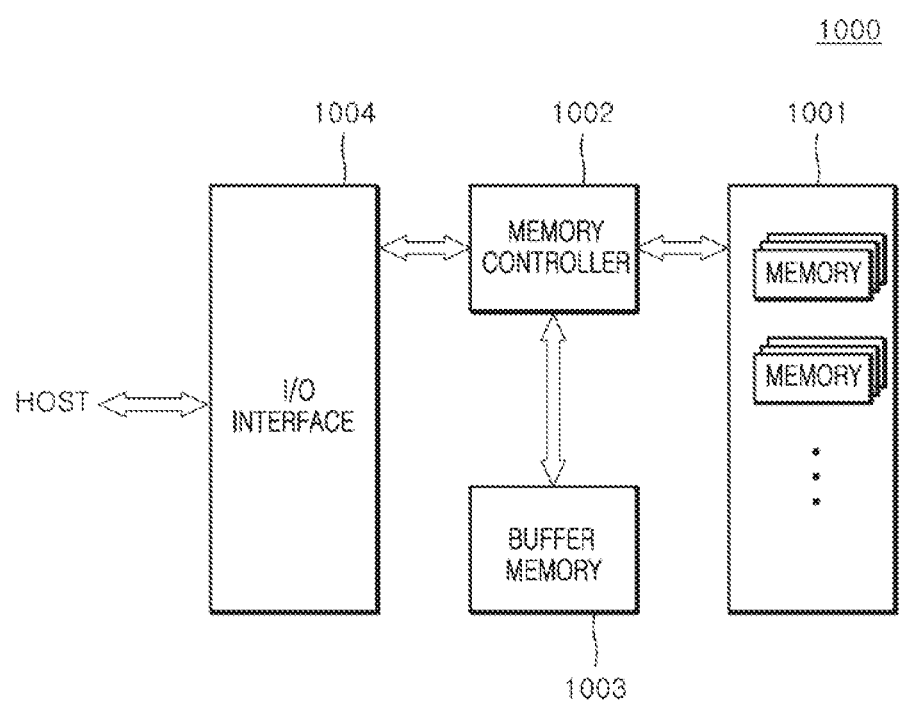
FIG. 12 is a block diagram illustrating a configuration of an electronic system employing at least one of the semiconductor devices described with reference to FIGS. 1 to 11.

At least one of the semiconductor devices described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include at least one of the semiconductor devices 1 and 2 illustrated in FIGS. 1 and 10. Meanwhile, the data storage circuit 1001 may include nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a row address generation circuit configured to generate a first row address from an active signal and a first bank address and configured to generate a second row address from the active signal and a second bank address;
a first region activated by the first row address and an internal address; and
a second region activated by the second row address and the internal address,
wherein one of the first and second bank addresses is selectively generated according to a command/address signal, and
wherein the first region includes a plurality of first word lines, all of the plurality of first word lines are activated by the first row address in a test mode, the second region includes a plurality of second word lines, all of the plurality of second word lines are activated by the second row address in the test mode.

2. The semiconductor device of claim 1, wherein the first and second regions are both located in a same memory region.

3. The semiconductor device of claim 1,
wherein the plurality of first word lines, any one of which is activated by the first row address and the internal address; and
wherein the first region outputs data when any one of the plurality of first word lines is activated.

4. The semiconductor device of claim 1,
wherein the plurality of second word lines, any one of which is activated by the second row address and the internal address; and
wherein the second region outputs data when any one of the plurality of second word lines is activated.

5. The semiconductor device of claim 1, wherein the row address generation circuit includes:
a first row address generation circuit configured to generate the first row address from the first bank address when the active signal is enabled; and
a second row address generation circuit configured to generate the second row address from the second bank address when the active signal is enabled.

6. The semiconductor device of claim 5, wherein the first bank address and the second bank address are both enabled in the test mode.

7. The semiconductor device of claim 5, wherein the first row address generation circuit includes:
a first pre-drive signal generation circuit configured to inversely buffer the first bank address to generate a first pre-drive signal when the active signal is enabled;
a first drive circuit configured to be initialized by a pre-charge signal and a reset signal and configured to generate a first drive signal based on the first pre-drive signal; and
a first latch circuit configured to latch the first drive signal and configured to buffer the latched signal of the first drive signal to generate the first row address.

8. The semiconductor device of claim 5, wherein the second row address generation circuit includes:
a second pre-drive signal generation circuit configured to inversely buffer the second bank address to generate a second pre-drive signal when the active signal is enabled;
a second drive circuit configured to be initialized by a pre-charge signal and a reset signal and configured to generate a second drive signal based on the second pre-drive signal; and
a second latch circuit configured to latch the second drive signal and configured to buffer the latched signal of the second drive signal to generate the second row address.

9. The semiconductor device of claim 1, further comprising:
a data input/output (I/O) circuit configured to output first internal data generated by the first row address as data when the active signal is enabled and configured to output second internal data generated by the second row address as the data when the active signal is enabled; and a compression circuit configured to compare and compress bit signals of the data to generate a comparison signal.

10. The semiconductor device of claim 9, wherein the data I/O circuit includes:
   a first data I/O circuit configured to drive the data based on the first internal data when the active signal is enabled; and
   a second data I/O circuit configured to drive the data based on the second internal data when the active signal is enabled.

11. The semiconductor device of claim 9, wherein the comparison signal is enabled when all bit signals of the data have the same logic level.

12. A semiconductor device comprising:
   a row address generation circuit configured to generate a first row address and a second row address from a first bank address and a second bank address, one of the first row address and the second row address being selectively generated according to an active signal and a command/address signal;
   a memory region configured to include a first region and a second region and configured to generate data from first internal data and second internal data stored in the first region and the second region, wherein the first region and the second region are activated by the first and second row addresses and an internal address; and
   a compression circuit configured to compare and compress bit signals of the data to generate a comparison signal.

13. The semiconductor device of claim 12, wherein the semiconductor device is configured such that the first bank address and the second bank address are enabled in a test mode for comparison and compressive testing of bit signals of the data.

14. The semiconductor device of claim 12,
   wherein the first region includes a plurality of first word lines, any one of which is activated by the first row address and the internal address; and
   wherein the first region outputs the first internal data when any one of the plurality of first word lines is activated.

15. The semiconductor device of claim 12,
   wherein the second region includes a plurality of second word lines, any one of which is activated by the second row address and the internal address; and
   wherein the second region outputs the second internal data when any one of the plurality of second word lines is activated.

16. The semiconductor device of claim 12, wherein the row address generation circuit includes:
   a first row address generation circuit configured to generate the first row address from the first bank address when the active signal is enabled; and
   a second row address generation circuit configured to generate the second row address from the second bank address when the active signal is enabled.

17. The semiconductor device of claim 16, wherein the first row address generation circuit includes:
   a first pre-drive signal generation circuit configured to inversely buffer the first bank address to generate a first pre-drive signal when the active signal is enabled;
   a first drive circuit configured to be initialized by a pre-charge signal and a reset and a first latch circuit configured to latch the first drive signal and configured to buffer the latched signal of the first drive signal to generate the first row address.

18. The semiconductor device of claim 16, wherein the second row address generation circuit includes:
   a second pre-drive signal generation circuit configured to inversely buffer the second bank address to generate a second pre-drive signal when the active signal is enabled;
   a second drive circuit configured to be initialized by a pre-charge signal and a reset signal and configured to generate a second drive signal based on the second pre-drive signal; and
   a second latch circuit configured to latch the second drive signal and configured to buffer the latched signal of the second drive signal to generate the second row address.

19. The semiconductor device of claim 12, wherein the memory region further includes a data input/output (I/O) circuit configured to output the first internal data generated by the first row address as data when the active signal is enabled and configured to output the second internal data generated by the second row address as the data when the active signal is enabled.

20. The semiconductor device of claim 19, wherein the data I/O circuit includes:
   a first data I/O circuit configured to drive the data based on the first internal data when the active signal is enabled; and
   a second data I/O circuit configured to drive the data based on the second internal data when the active signal is enabled.

21. A semiconductor device comprising:
   a row address generation circuit configured to generate first, second, third, and fourth row addresses from first, second, third, and fourth bank addresses when an active signal is enabled;
   a first memory region configured to output first and second internal data stored in first and second regions activated by the first and second row addresses and an internal address as data; and
   a second memory region configured to output third and fourth internal data stored in third and fourth regions activated by the third and fourth row addresses and the internal address as the data,
   wherein one of the first and second bank addresses is selectively generated according to a command/address signal, and one of the third and fourth bank addresses is selectively generated according to the command/address signal, and
   wherein the first region includes a plurality of first word lines, all of the plurality of first word lines are activated by the first row address in a test mode, the second region includes a plurality of second word lines, all of the plurality of second word lines are activated by the second row address in the test mode, the third region includes a plurality of third word lines, all of the plurality of third word lines are activated by the third row address in the test mode, the fourth region includes a plurality of fourth word lines, all of the plurality of fourth word lines are activated by the fourth row address in the test mode.

22. The semiconductor device of claim 21, further comprising a compression circuit configured to compare and compress bit signals of the data to generate a comparison signal.

23. The semiconductor device of claim 22, wherein the comparison signal is enabled when all of the bit signals of the data have the same logic level.

* * * * *